United States Patent [19]
Ohsawa et al.

[11] Patent Number: 5,349,238
[45] Date of Patent: Sep. 20, 1994

[54] SEMICONDUCTOR DEVICE

[75] Inventors: Kenji Ohsawa; Mutsumi Nagano; Akira Kojima; Hideyuki Takahashi, all of Kanagawa, Japan

[73] Assignee: Sony Corporation, Tokyo, Japan

[21] Appl. No.: 950,659

[22] Filed: Sep. 23, 1992

[30] Foreign Application Priority Data

Sep. 25, 1991 [JP] Japan ................... 3-274843

[51] Int. Cl.$^5$ ................ H01L 23/48; H01L 29/44; H01L 29/52; H01L 29/60
[52] U.S. Cl. .................... 257/736; 257/666; 257/672; 257/673; 257/741; 257/750; 257/751; 257/762; 257/781
[58] Field of Search ............ 357/68, 70; 257/666, 257/672, 676, 677, 778, 779, 673, 735, 736, 737, 741, 762, 765, 781, 750, 751

[56] References Cited

U.S. PATENT DOCUMENTS

| | | | |
|---|---|---|---|
| 4,661,837 | 4/1987 | Sono | 357/84 |
| 4,701,363 | 10/1987 | Barber | 428/137 |
| 4,736,236 | 4/1988 | Butt | 357/70 |
| 4,806,503 | 2/1989 | Yoshida et al. | 437/206 |
| 4,935,803 | 6/1990 | Kalfus et al. | 357/68 |
| 5,014,111 | 5/1991 | Tsuda et al. | 357/68 |
| 5,086,335 | 2/1992 | Leibovitz et al. | 257/692 |
| 5,109,270 | 4/1992 | Nambu et al. | 357/74 |

FOREIGN PATENT DOCUMENTS 61-244056 10/1986 Japan ................... 257/677

Primary Examiner—Jerome Jackson
Assistant Examiner—T. M. Arroyo
Attorney, Agent, or Firm—Hill, Steadman & Simpson

[57] ABSTRACT

Disclosed is a semiconductor device comprising a lead frame which includes a metal layer forming an outer lead, a thin metal layer forming an inner lead, an intermediate layer held between the thick metal layer and the thin metal layer for forming a connection portion between the outer lead and the inner lead and a bump positioned at the extreme end of the lead frame, whereby making the lead frame as an electrode leading means by directly connecting the bump to each electrode of a semiconductor element, wherein the lead formed of the thick metal layer has a thickness of 30 to 300 μm, the lead formed of the thin metal layer has a thickness of 10 to 50 μm, and the bump has thickness of 5 to 50 μm.

6 Claims, 6 Drawing Sheets

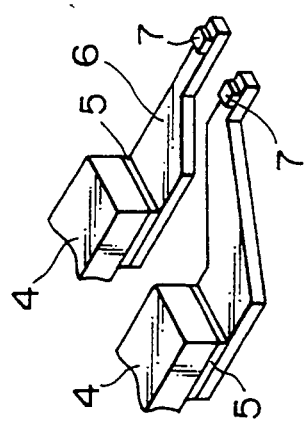
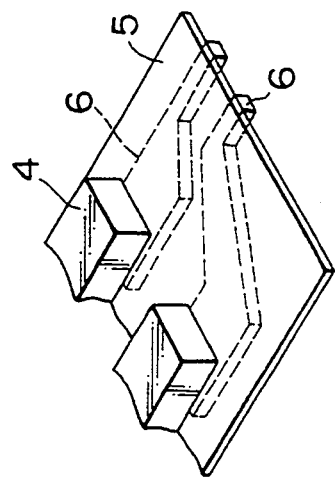
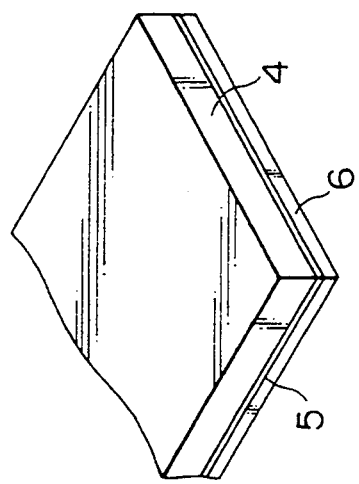
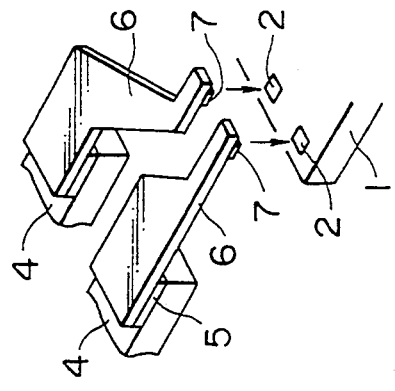
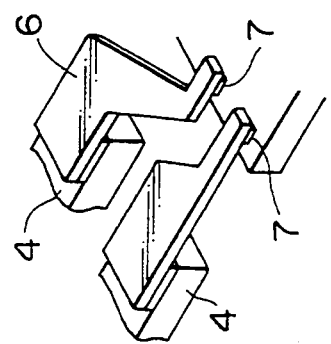
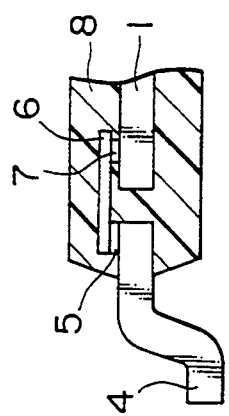

FIG. 3
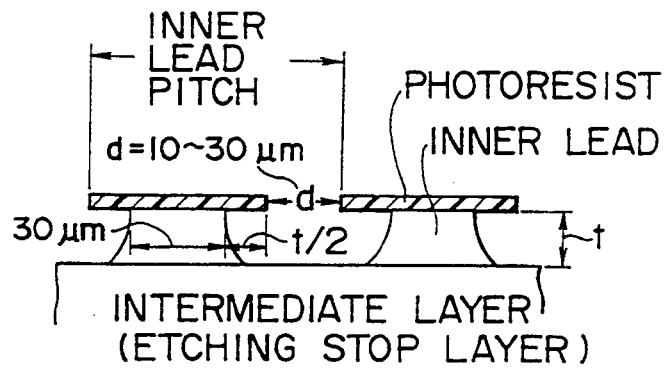
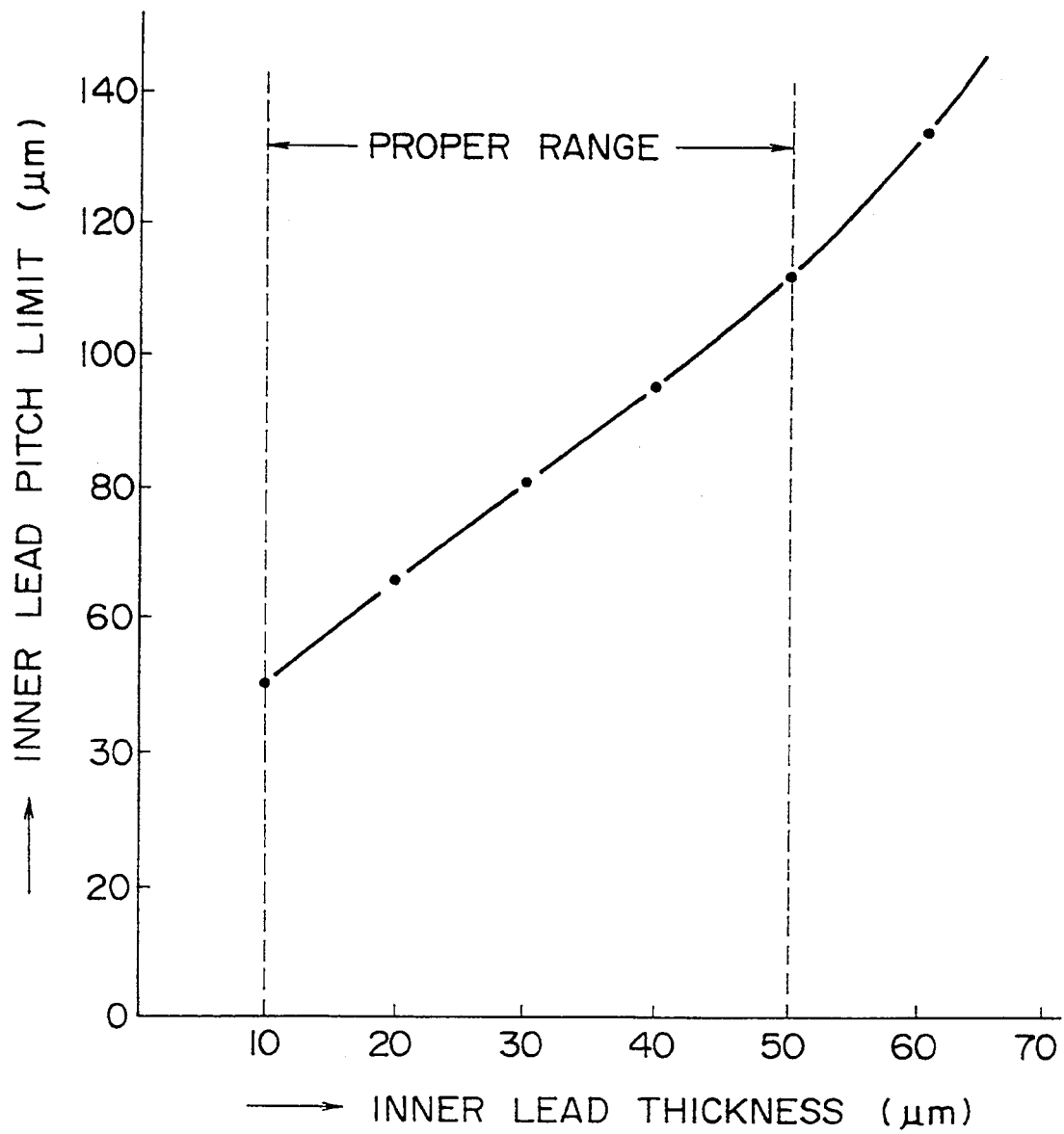

FIG. 4
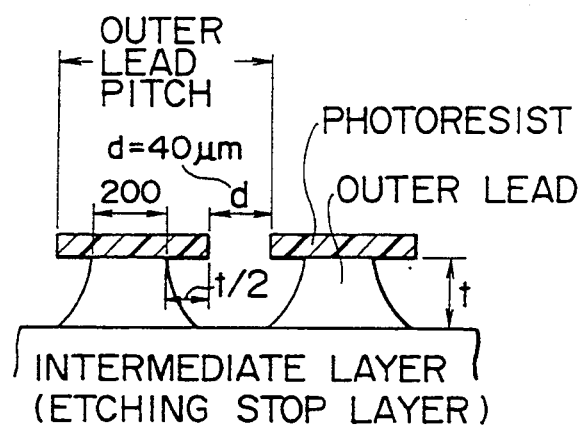
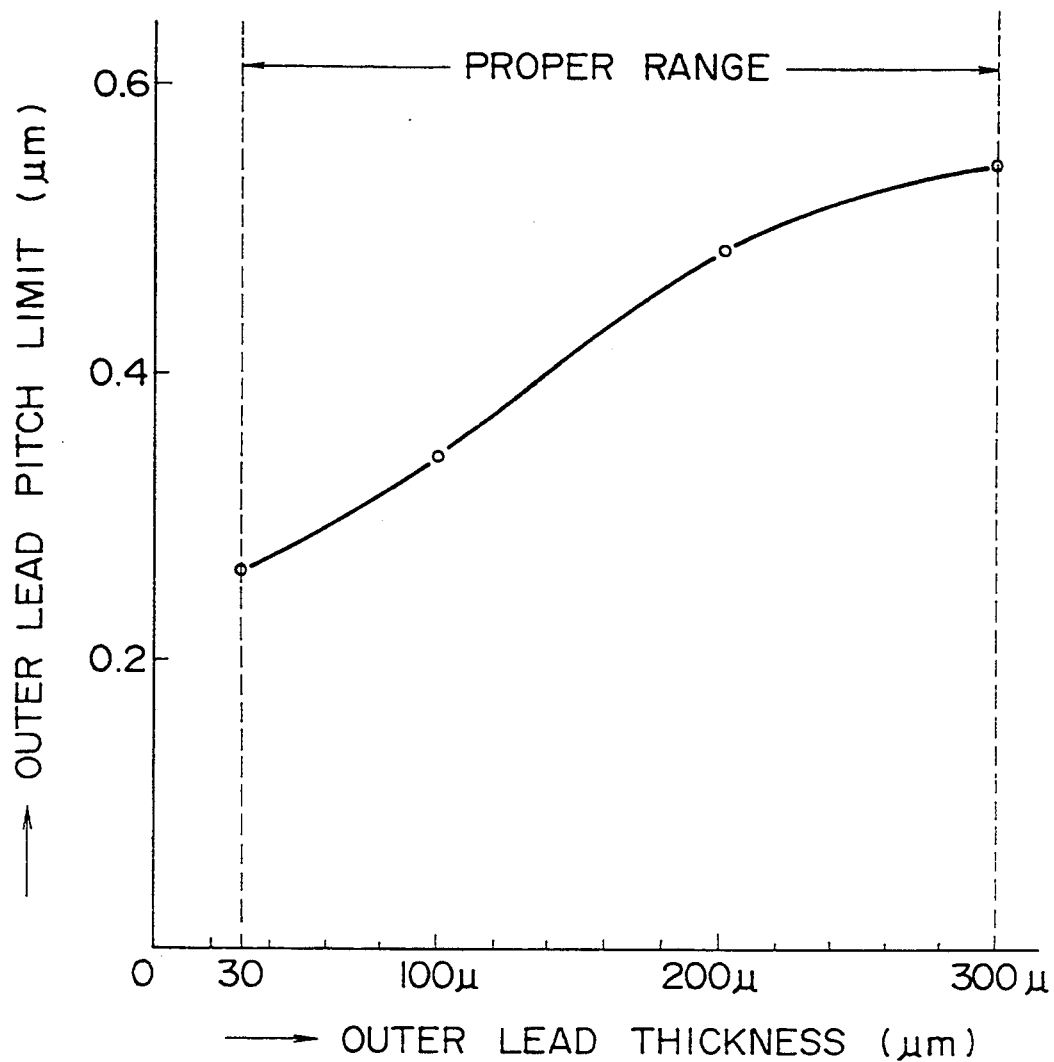

FIG. 5
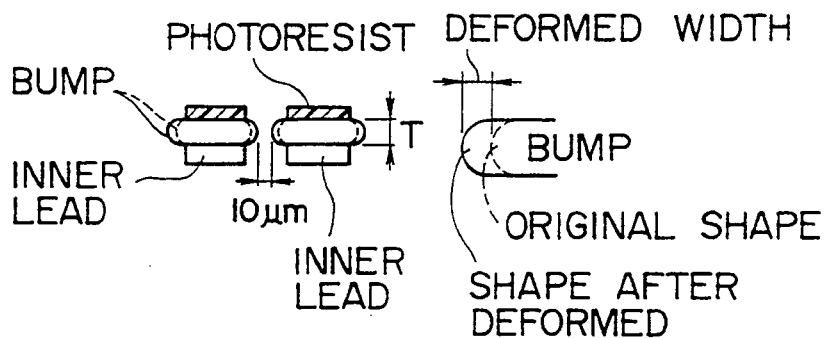
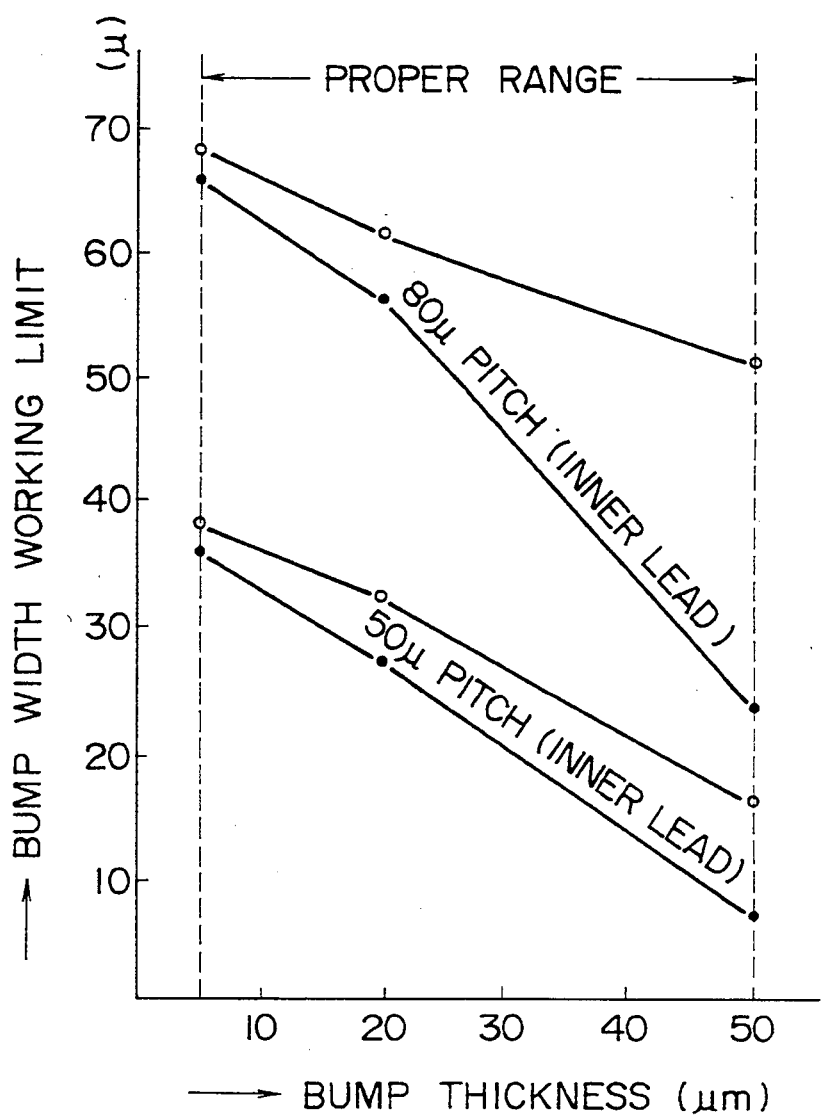

SEMICONDUCTOR DEVICE

BACKGROUND OF THE INVENTION

1. Field of the Invention

The present invention relates to a semiconductor device including a lead frame having a three-layer structure of an intermediate layer formed as a metal made etching stop layer, a lead formed of a thick metal layer on one surface of the intermediate layer, and a lead formed of a thin metal layer on the other surface thereof, wherein a bump formed of the intermediate layer is formed on the lead formed of the thin metal layer, whereby making the lead frame as an electrode leading means by directly connecting the bump to each electrode of a semiconductor element.

One type of semiconductors has a such structure as using a lead frame and connecting an electrode of the semiconductor device to the extreme end of the inner lead thereof through a gold wire.

Another type of a semiconductor has such a structure as using a TAB lead in place of the lead frame, which includes a polyimide film as a base and a lead made of a silver foil formed on the surface of the base, and directly connecting the inner lead of the TAB lead to the pad of the semiconductor element.

The other type of semiconductors has such a structure as using the lead frame with the inner lead on which a bump is formed, and connecting the bump to the electrode pad of the semiconductor element without any wire.

Incidentally, the semiconductor device using the lead frame and connecting the inner lead thereof to the electrode pad of the semiconductor element through a gold wire has the following disadvantage: namely, the tendency of thinning of the package is restricted due to deflection of the wire and the reduction in a cost is also restricted by the use of the gold wire; and it is difficult to make the disposed pitch of each inner lead less than 120 μm and hence to satisfy the tendency of increasing pins.

Also, the semiconductor device using the TAB lead has a disadvantage that, since the outer lead is formed of the silver foil to the same thickness as that of the inner lead, it is difficult to obtain the necessary strength as the outer lead. Further, since it is difficult to thin the silver foil stuck on the polyimide base and hence to obtain the fine pitch.

Accordingly, in the viewpoints of the tendencies of thinning and fine pitching and of securing strength of the outer lead, there can be proposed the semiconductor device using the lead frame with the inner lead on which a bump is formed, and connecting the bump to the electrode pad of the semiconductor element without any wire. However, in the existing circumstance, there is not developed the concrete technique to secure the strength of the outer lead at a desired value while satisfying the tendency of fine pitching.

SUMMARY OF THE INVENTION

It is therefore an object of the present invention to provide a semiconductor device using the lead frame with the inner lead on which a bump is formed, and connecting the bump to the electrode pad of each semiconductor element without any wire, whereby satisfying the tendencies of fine pitching and increasing pins and further miniaturization while securing the strength of the outer lead.

To achieve the above object, according to the present invention, there is provided a semiconductor device comprising a lead frame which includes a metal layer forming an outer lead, a thin metal layer forming an inner lead, an intermediate layer held between the thick metal layer and the thin metal layer for forming a connection portion between the outer lead and the inner lead and a bump positioned at the extreme end of the lead frame, whereby making the lead frame as an electrode leading means by directly connecting the bump to each electrode of a semiconductor element, wherein the lead formed of the thick metal layer has a thickness of 30 to 300 μm, the lead formed of the thin metal layer has a thickness of 10 to 50 μm, and the bump has thickness of 5 to 50 μm.

BRIEF DESCRIPTION OF THE DRAWINGS

FIGS. 2A to 2E are perspective views showing a manufacturing method of the semiconductor device as shown in FIGS. 1A and 1B in order of processes;

FIG. 2F is a cross-sectional view showing one process of the manufacturing method of the semiconductor device as shown in FIGS. 1A and 1B;

FIG. 3 shows a relationship between the thickness of the the inner lead and the limit of the inner lead pitch;

FIG. 4 shows a relationship between the thickness of the outer lead and the limit of the outer lead pitch.

FIG. 5 shows a relationship between the bump thickness and the working limit of the bump width.

DETAILED DESCRIPTION OF THE PREFERRED EMBODIMENTS

Hereinafter, one embodiment of the present invention will be described in detail with reference to the accompanying drawings.

Figure 1A:
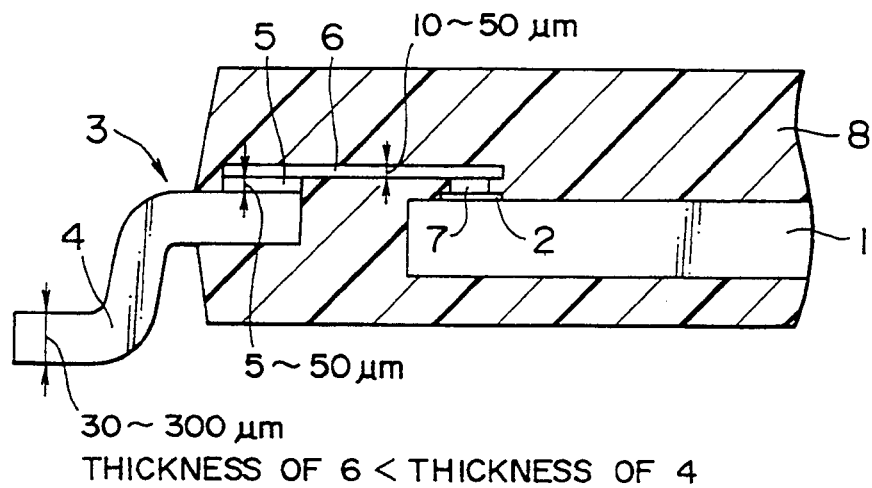
FIG. 1A is a cross-sectional view showing part of a semiconductor device according to one embodiment of the present invention.
Figure 1B:
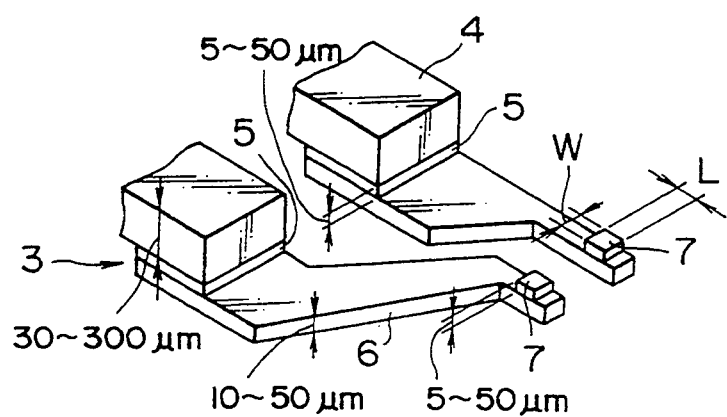
FIG. 1B is a perspective view showing part of the reversed lead frame of the semiconductor device as shown in FIG. 1A.

FIGS. 1A and 1B show one embodiment of a semiconductor device of the present invention: FIG. 1A is a cross-sectional view showing part of the semiconductor device; and FIG. 1B is a perspective view showing part of the reversed lead frame.

In these Figures, numeral 1 indicates a semiconductor element, 2 is an electrode pad made of, for example, aluminum, formed on the surface of the semiconductor element 1, 3 is a lead frame, and 4 is an outer lead formed of copper or iron-nickel alloy (42 alloy). The outer lead 4 has a thickness of 30–300 μm. With the thickness thereof being less than 30 μm, the required strength is not secured. With the thickness thereof exceeding 300 μm, the pitch of the outer lead 4 is made larger than 0.5 mm, thus making it difficult to obtain the fine pitch. Therefore, the thickness of the outer lead 4 is, preferably, within the range of 30–300 μm.

Numeral 5 indicates an intermediate layer of the lead frame 3. The intermediate layer 5 is made of, for example, aluminum and has a thickness of 5–50 μm. In etching for patterning the inner lead and outer lead of the lead frame 3, the intermediate layer 5 serves as an etching stopper, and further, is etched itself to thus become a bump (7) described later.

The thickness of the intermediate layer 5 (namely, the thickness of the bump) is, preferably, within the range of 5-50 μm. The reason for this is as follows: with the thickness being less than 5 μm, the lamination of the foil is difficult; and with the thickness exceeding 50 μm, it is difficult to obtain the fine pitch.

Numeral 6 indicates an inner lead made of copper. The thickness of the inner lead 6 is within the range of 10-50 μm. This is because, with the thickness being less than 10 μm, it is difficult to secure the required strength and to be laminated as a foil on the intermediate layer 5, and with the thickness exceeding 50 μm, the pitch of the inner lead is made larger to be 110 μm, thus making it difficult to increase the number of the pins. Accordingly, the thickness of the inner lead is, preferably, within the range of 10-50 μm. In addition, the inner lead 6 needs to be thinner than the outer lead 4.

Numeral 7 indicates a bump formed by selective etching of the intermediate layer 5 made of aluminum on the surface of the extreme end portion of the inner lead 6. The bump 7 has a size of a thickness of 5-50 μm, a width W of 10-140 μm, and a length L of 30 μm or more.

The bump 7 is bonded on the electrode pad 2 of the semiconductor element 1 by ultrasonic bonding. Numeral 8 indicates a sealing resin.

FIGS. 2A to 2F show the manufacturing method of the semiconductor device as shown in FIGS. 1A and 1B in order of processes: FIGS. 2A to 2E are perspective views; and FIG. 2F is a cross-sectional view.

First, as shown in FIG. 2A, there is prepared a lead frame material having a three-layer structure of the metal layer 4 made of copper or 42 alloy as the outer lead, the intermediate layer 5 made of aluminum as the etching stop layer and also as the bump 7, and the inner lead 6 made of copper as the inner lead.

Next, as shown in FIG. 2B, the inner lead 6 and the outer lead 4 are subjected to patterning by selective etching in order (or simultaneously). The etchings for the inner lead 6 and the outer lead 7 must be executed in such a manner that the intermediate layer 5 functions as an etching stopper. In the case that the metal to be etched is copper, the solution of $H_2SO_4$(18 vol %)+$H_2O_2$(10 vol %) is preferably used as an etchant. In the case of iron-nickel alloy (42 alloy), the solution of $C_2H_2O_4$(10 vol %)+$H_2O_2$(10 vol %) is preferably used as an etchant.

After that, as shown in FIG. 2C, the unnecessary portion of the intermediate layer 5 is removed.

The removal is executed by etching using an etchant of HCl (50 vol %)+$H_2O$ (50 vol %) and an electrodeposition resist film as a mask.

As shown in FIG. 2D, the lead frame is reversed, and each bump 7, 7, . . . is positioned to each electrode pad 2, 2, . . . of the semiconductor element 1. Each bump 7, 7, . . . is then bonded to each pad 2, 2, . . . by ultrasonic bonding, and is resin-sealed as shown in FIG. 2F.

FIG. 3 shows a relationship between the thickness of the the inner lead and the limit of the inner lead pitch (lower limit).

The limit of the inner lead pitch is represented as an equation of 30+(2t/2)+(10-30) μm. In this equation, the term of 30 μm means the minimum width (flat width) to secure the strength and adhesiveness of the inner lead; (2t/2) μm is the total amount of side etchings generated on both sides of each lead (etch factor is taken as 2); $<t>$ is the thickness of the inner lead; and (10-30) μm is the minimum width $<d>$ for resolution of the photoresist which is dependent on the thickness of the resist film.

The width $<d>$ is takes as 10, 15, 20, or 30 μm depending to the resist film thickness of 10, 20, 30, or 50 μm.

In addition, letting the thickness of the inner lead being 10 μm, it is possible to make the inner lead pitch as 50 μm.

FIG. 4 shows a relationship between the thickness of the outer lead and the limit of the outer lead pitch.

The limit of the outer lead pitch is represented as an equation of 20+(2t/2)+40 μm. In this equation, the term of 200 μm means the value necessary to secure the strength of the outer lead; (2t/2) μm is the total amount of side etchings on both sides of the outer lead (etch factor is taken as 2); and 40 μm is the minimum interval $<d>$ between outer leads determined by resolution of the photoresist in the case that the photoresist film is made larger enougth to etch the thick outer lead.

FIG. 5 shows a relationship between the bump thickness and the working limit of the bump width. In this figure, the lower two curves shows the relationships at the inner lead pitch of 50 μm; and the upper two curves show the relationships at the inner lead pitch of 80 μm. In each case, of two curves, the upper one shows the relationship from the viewpoint of prohibiting occurrence of the bonding failure, and the lower one shows the relationship from the viewpoint of prohibiting the impossibility of the side etching working.

Figure 6:
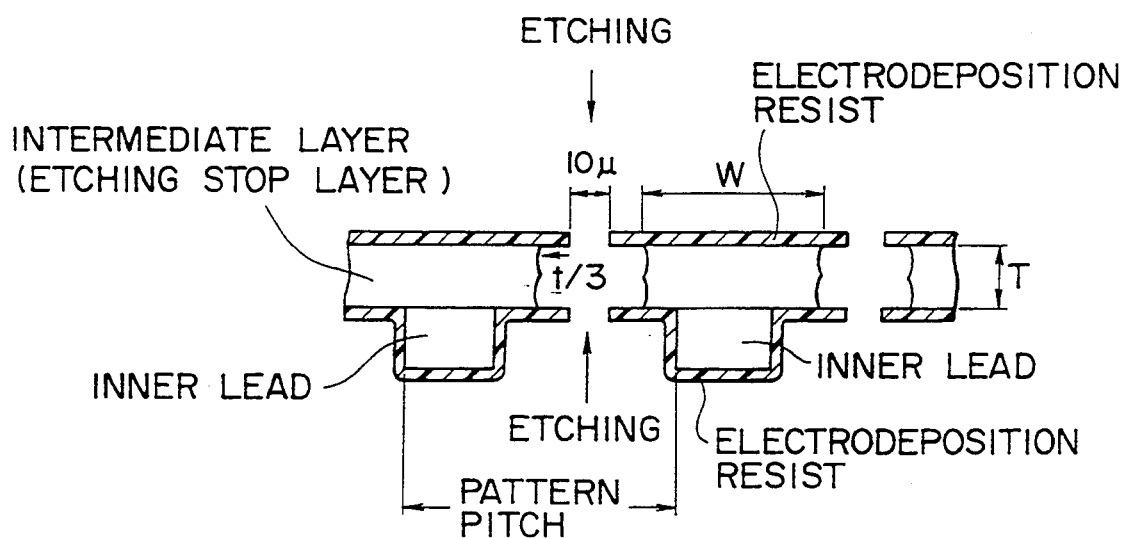
FIG. 6 is a cross-sectional view for explaining the etching for forming a bump.

The working limit of the bump width is represented as an equation of inner lead pitch-10 μm-(2T/3). In this equation, T means the bump thickness; 10 μm is the minimum width to preventing a short-circuit when the bump is deformed by bonding; and (2T/3) is the total amount of the side etching generated on both sides of the bump (etch factor is taken as 1.5). In this case, since the intermediate layer made of aluminum is etched from both sides as shown in FIG. 6, the side etching amount becomes (2T/3).

As for the proper value of the bump width W, in the case of the inner lead pitch being 50 μm; W is 10-38 μm for the bump thickness of 5 μm; W is 10-32 μm for the bump thickness of 20 μm; and W is 10-20 μm for the bump thickness of 50 μm.

Next, in the case of the inner lead pitch being 80 μm: W is 10-68 μm for the bump thickness of 5 μm; W is 10-62 μm for the bump thickness of 20 μm; and W is 10-50 μm for the bump thickness of 50 μm.

Further, in the case of the inner lead pitch being 150 μm: W is 10-136 μm for the bump thickness of 5 μm; W is 10-126 μm for the bump thickness of 20 μm; and W is 106 μm for the bump thickness of 50 μm.

In addition, when the bump length L is less than 30 μm, the adhesiveness is insufficient. Accordingly, the bump length L is preferably within the range of 30 μm or more.

What is claimed is:

1. A lead frame made by the following process comprising, the steps of etching with a first etchant, a three layer metal structure wherein first and second outer metal layers are made of a material which is etched by said first etchant and a third intermediate metal layer is not etched by said first etchant so as to form a relatively thick outer lead from said first outer metal layer which extends in a first direction and so as to form a relatively thin inner lead from said second outer metal layer which overlaps said first outer metal layer and extends in a direction opposite to said first direction, and etching said third intermediate metal layer with a second etchant to form an electrical path area between said first and second outer metal layers in an overlap area and to also form a bump on said second outer metal layer which is remote from said overlap area, and, wherein said first outer metal layer comprises 42 alloy or copper, said second outer metal layer comprises copper and said third intermediate metal layer comprises aluminum.

2. A lead frame made by the process of claim 1 including the additional step of connecting said bump to a conducting area on a semiconductor element.

3. A lead frame made by the process of claim 1 wherein said bump is connected to said conducting area by ultrasonic bonding.

4. A lead frame made by the following process comprising, the steps of etching with a first etchant, a three layer metal structure wherein first and second outer metal layers are made of a material which is etched by said first etchant and a third intermediate metal layer is not etched by said first etchant so as to form a relatively thick outer lead from said first outer metal layer which extends in a first direction and so as to form a relatively thin inner lead from said second outer metal layer which overlaps said first outer metal layer and extends in a direction opposite to said first direction, and etching said third intermediate metal layer with a second etchant to form an electrical path area between said first and second outer metal layers in an overlap area and to also form a bump on said second outer layer which is remote from said overlap area, and, wherein said bump has a width ranging from 10 to 140 $\mu$m.

5. A lead frame made by the following process comprising, the steps of etching with a first etchant, a three layer metal structure wherein first and second outer metal layers are made of a material which is etched by said first etchant and a third intermediate metal layer is not etched by said first etchant so as to form a relatively thick outer lead from said first outer metal layer which extends in a first direction and so as to form a relatively thin inner lead from said second outer metal layer which overlaps said first outer metal layer and extends in a direction opposite to said first direction, and etching said third intermediate metal layer with a second etchant to form an electrical path area between said first and second outer metal layers in an overlap area and to also form a bump on said second outer layer which is remote from said overlap area, and wherein said outer lead has a thickness of 30 to 300 $\mu$m, and wherein said inner lead has a thickness of 10 to 50 $\mu$m, and wherein said electrical path area and said bump have thickness of 5 to 50 $\mu$m.

6. A lead frame made by the following process comprising, the steps of etching with a first etchant, a three layer metal structure wherein first and second outer metal layers are made of a material which is etched by said first etchant and a third intermediate metal layer such as aluminum which is not etched by said first etchant so as to form a relatively thick outer lead from said first outer metal layer which extends in a first direction and so as to form a relatively thin inner lead from said second outer metal layer which overlaps said first outer metal layer and extends in a direction opposite to said first direction, and etching said third intermediate metal layer with a second etchant which does not etch said first and second outer metal layers to form an electrical path area between said first and second outer metal layers in an overlap area and to also form a bump on said second outer metal layer which is remote from said overlap area.

* * * * *